(12) United States Patent
Lin et al.

(10) Patent No.: US 10,937,775 B2
(45) Date of Patent: Mar. 2, 2021

(54) DISPLAY DEVICE

(71) Applicant: Innolux Corporation, Miao-Li County (TW)

(72) Inventors: Chun-Hsien Lin, Miao-Li County (TW); Shun-Yuan Hu, Miao-Li County (TW); Tsau-Hua Hsieh, Miao-Li County (TW); Li-Wei Mao, Miao-Li County (TW); Tung-Kai Liu, Miao-Li County (TW); Shu-Ming Kuo, Miao-Li County (TW); Chih-Yung Hsieh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 16/420,195

(22) Filed: May 23, 2019

(65) Prior Publication Data

US 2019/0279972 A1    Sep. 12, 2019

Related U.S. Application Data

(62) Division of application No. 15/486,316, filed on Apr. 13, 2017, now Pat. No. 10,361,179.

(Continued)

(30) Foreign Application Priority Data

Nov. 16, 2016 (CN) .......................... 2016 1 1007129

(51) Int. Cl.
*H01L 27/32* (2006.01)
*H01L 25/16* (2006.01)

(Continued)

(52) U.S. Cl.
CPC ........ *H01L 25/167* (2013.01); *H01L 25/0753* (2013.01); *H01L 33/62* (2013.01); *H01L 27/1255* (2013.01)

(58) Field of Classification Search
CPC . H01L 27/15; H01L 27/3206; H01L 27/3211; H01L 27/322
See application file for complete search history.

(56) References Cited

U.S. PATENT DOCUMENTS

| 2008/0025024 A1* | 1/2008 | Yu .......................... H05B 45/00 362/249.16 |
| 2015/0340001 A1* | 11/2015 | Jung ................. G02F 1/136286 345/205 |
| 2016/0302269 A1* | 10/2016 | Kanemitsu ........... G09G 3/3406 |

FOREIGN PATENT DOCUMENTS

| CN | 101009304 | 8/2007 |
| CN | 103311267 | 9/2013 |
| CN | 103456763 | 12/2013 |

OTHER PUBLICATIONS

"Office Action of China Counterpart Application," dated Jun. 21, 2019, p. 1-p. 15.

* cited by examiner

*Primary Examiner* — Jae Lee
(74) *Attorney, Agent, or Firm* — JCIPRNET

(57) ABSTRACT

Provided is a display device, which includes a substrate, a transistor, a capacitor and a light emitting unit. The transistor and the capacitor are disposed on the substrate. The light emitting unit is disposed on the substrate and arranged corresponding to the capacitor. The light emitting unit includes a first light emitting diode. The first light emitting diode is electrically connected with the transistor and over- (Continued)

laps the capacitor. The display device has favorable space utilization, provides a repair function, or reduces the probability of failure.

19 Claims, 9 Drawing Sheets

Related U.S. Application Data

(60) Provisional application No. 62/361,543, filed on Jul. 13, 2016, provisional application No. 62/350,169, filed on Jun. 14, 2016, provisional application No. 62/339,107, filed on May 20, 2016.

(51) Int. Cl.
*H01L 33/62* (2010.01)
*H01L 25/075* (2006.01)
*H01L 27/12* (2006.01)

DISPLAY DEVICE

CROSS-REFERENCE TO RELATED APPLICATION

This application is a divisional application of and claims the priority benefit of a prior application Ser. No. 15/486,316, filed on Apr. 13, 2017, now allowed. The prior application Ser. No. 15/486,316 claims the priority benefits of U.S. provisional application Ser. No. 62/339,107, filed on May 20, 2016, U.S. provisional application Ser. No. 62/350,169, filed on Jun. 14, 2016, U.S. provisional application Ser. No. 62/361,543, filed on Jul. 13, 2016, and China application serial no. 201611007129.0, filed on Nov. 16, 2016. The entirety of each of the above-mentioned patent applications is hereby incorporated by reference herein and made a part of this specification.

BACKGROUND OF THE INVENTION

Field of the Invention

The invention relates to a device and more particularly relates to a display device.

Description of Related Art

Light emitting diode (LED) display device has the advantages of active luminescence, high brightness, high contrast, low power consumption, etc., and has a longer service life than organic light emitting diode (OLED) display device. Therefore, it has become one of the most potential display technologies in recent years. In order to meet the requirement of high resolution, LED display device is developed to be composed of an active device array substrate and micron-sized light emitting diodes that are arranged in an array.

SUMMARY OF THE INVENTION

The invention provides a display device that has favorable space utilization, provides a repair function, or reduces the probability of failure.

A display device of the invention includes a substrate, a transistor, a capacitor and a light emitting unit. The transistor and the capacitor are disposed on the substrate. The light emitting unit is disposed on the substrate and arranged corresponding to the capacitor. The light emitting unit includes a first light emitting diode. The first light emitting diode is electrically connected with the transistor and overlaps the capacitor.

A display device of the invention includes a substrate, a transistor and a light emitting unit. The transistor is disposed on the substrate. The light emitting unit is disposed on the substrate and includes a plurality of light emitting diodes. The light emitting diodes are electrically connected with the transistor, and at least two of the light emitting diodes are connected in parallel.

A display device of the invention includes a substrate, a transistor and a light emitting unit. The transistor is disposed on the substrate. The light emitting unit is disposed on the substrate and includes two light emitting diodes. The two light emitting diodes are electrically connected with the transistor and respectively include a first sub light emitting diode and a second sub light emitting diode. The two light emitting diodes are connected in series, and the first sub light emitting diode and the second sub light emitting diode are connected in parallel.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
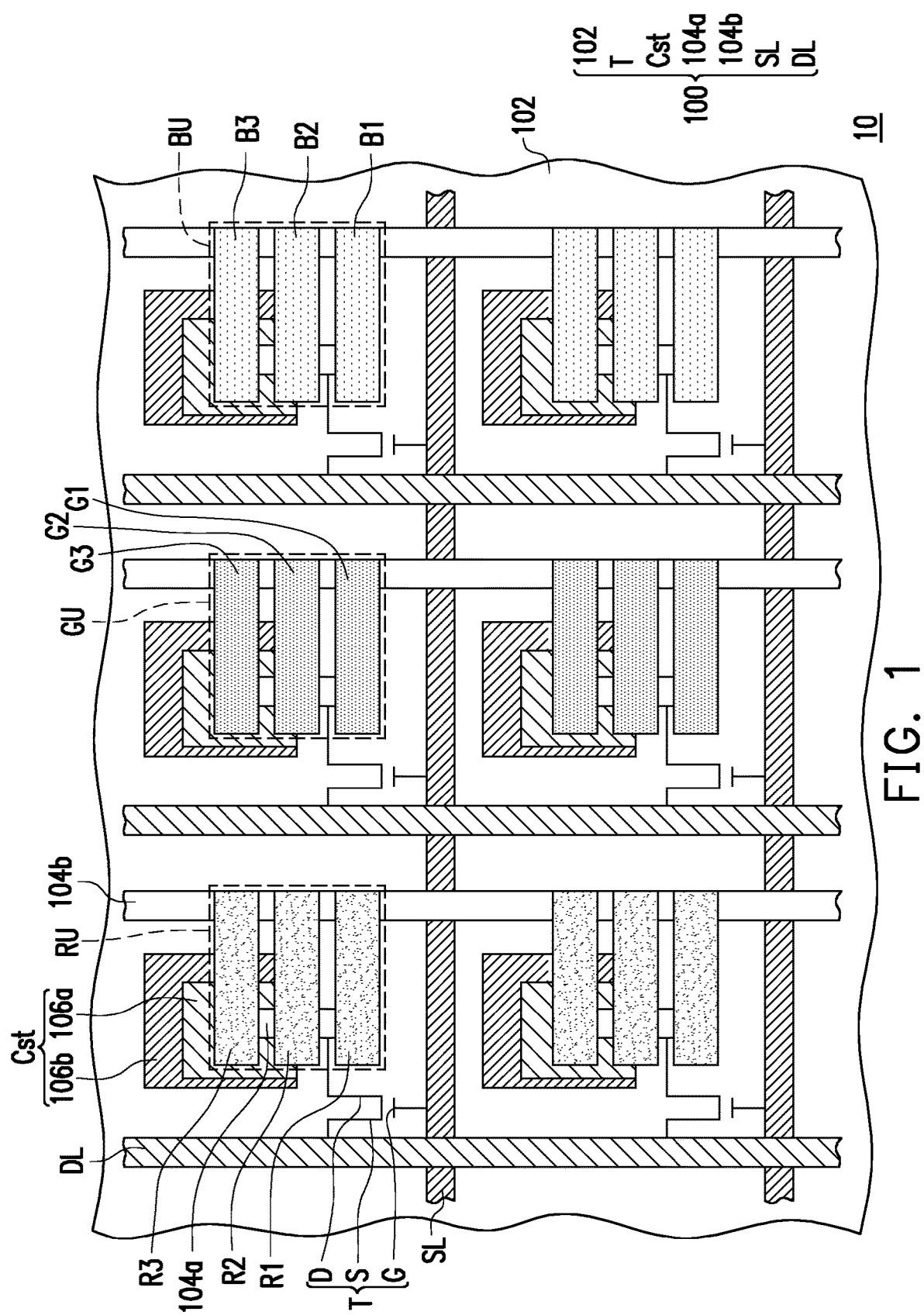
FIG. 1 is a partial top view of the display device according to the first embodiment of the invention.
Figure 2:
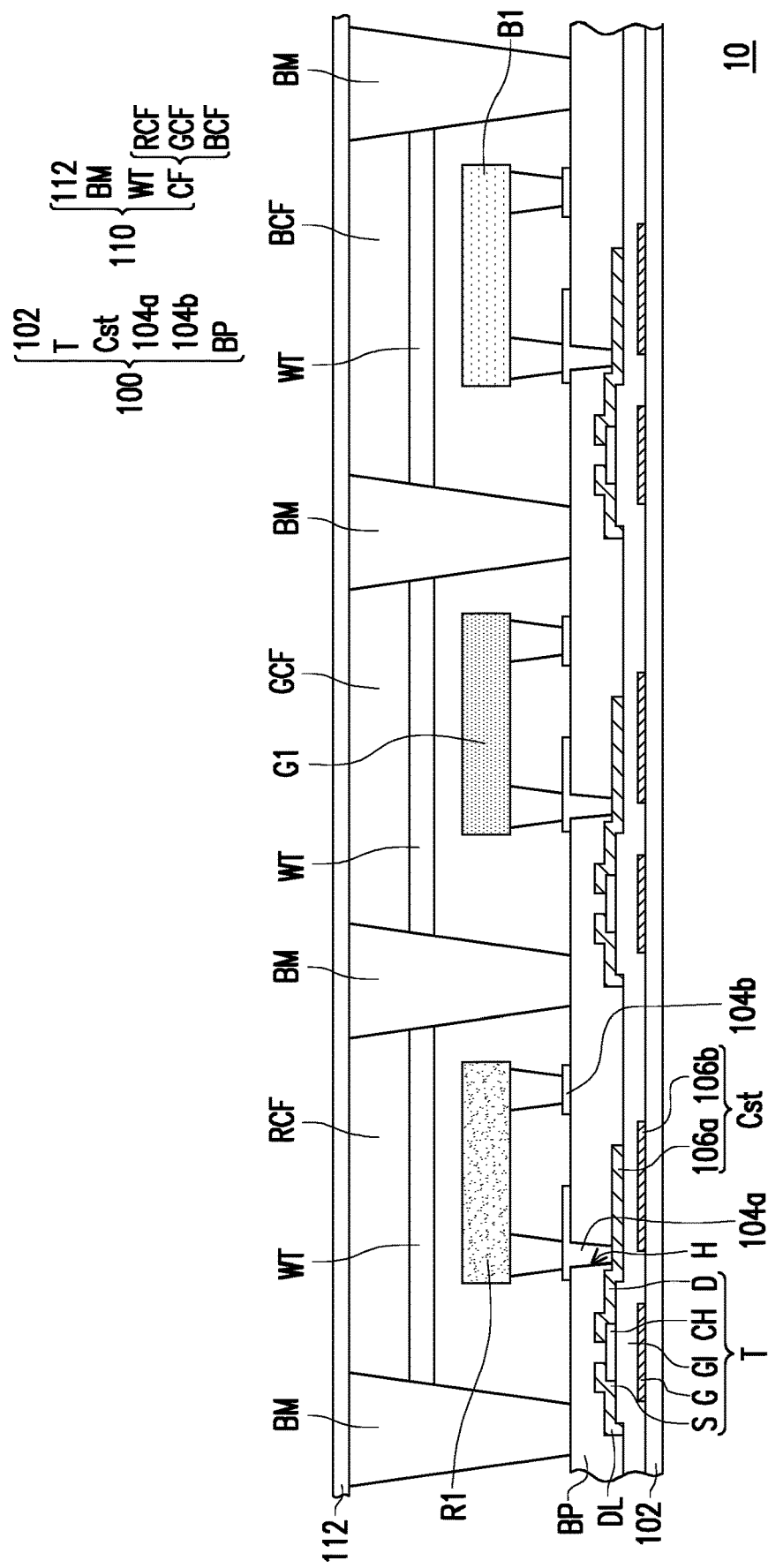
FIG. 2 is a partial cross-sectional view of the display device according to the first embodiment of the invention.

FIG. 1 is a partial top view of a display device according to the first embodiment of the invention. FIG. 2 is a partial cross-sectional view of the display device according to the first embodiment of the invention. It should be noted that a display device 10 described in this embodiment includes a plurality of light emitting units that are arranged in an array, for example. Nevertheless, the invention is not limited thereto. Specifically, in this embodiment, the light emitting units include a plurality of red light emitting units RU, a plurality of green light emitting units GU and a plurality of blue light emitting units BU. Although the light emitting units described in this embodiment emit lights of three different colors, the invention is not limited thereto. In other embodiments, the light emitting units may emit lights of the same color or at least two different colors. Moreover, in this embodiment, the capacitor is implemented by a circuit storage capacitor Cst, for example, but the invention is not limited thereto. In other embodiments, the capacitor that overlaps at least one of a plurality of light emitting diodes may be any capacitor composed of two electrodes with an insulating medium therebetween, which is commonly known to those skilled in the art.

Referring to FIG. 1 and FIG. 2, in this embodiment, the display device 10 includes an array substrate 100, a plurality of red light emitting units RU, a plurality of green light emitting units GU, a plurality of blue light emitting units BU and an opposite substrate 110. Moreover, the opposite substrate 110 is omitted from FIG. 1.

In this embodiment, the array substrate 100 includes a substrate 102, a plurality of circuit storage capacitors Cst and a plurality of transistors T disposed on the substrate 102. Besides, in this embodiment, the array substrate 100 further includes a plurality of scan lines SL, a plurality of data lines DL, a plurality of first electrodes 104a and a plurality of second electrodes 104b disposed on the substrate 102.

An extension direction of the scan lines SL is different from an extension direction of the data lines DL. Preferably, the extension direction of the scan lines SL is perpendicular to the extension direction of the data lines DL. Moreover, the scan lines SL and the data lines DL are located on different layers, and a gate insulating layer GI is disposed between the scan lines SL and the data lines DL (details thereof will be described later). Considering electrical conductivity, generally the scan lines SL and the data lines DL are formed of a metal material. Nevertheless, the invention is not limited thereto. In other embodiments, the scan lines SL and the data lines DL may be formed of other conductive materials, such as an alloy, a nitride of the metal material, an oxide of the metal material, a nitrogen oxide of the metal material, or a stack layer of the metal material and the foregoing conductive materials, for example (but not limited thereto).

The transistors T are arranged in an array corresponding to the red light emitting units RU, the green light emitting units GU and the blue light emitting units BU. Specifically, one transistor T is electrically connected with one light emitting unit, wherein the light emitting unit may be the red light emitting unit RU, the green light emitting unit GU or the blue light emitting unit BU, and each transistor T is electrically connected with one of the scan lines SL and one of the data lines DL. In this embodiment, the transistors T are driving devices, for example. Each transistor T includes a gate electrode G, the gate insulating layer GI, a channel layer CH, a source electrode S and a drain electrode D, for example.

In this embodiment, the gate electrode G is electrically connected with the corresponding scan line SL. From another aspect, the gate electrodes G and the scan lines SL belong to the same film layer. That is, the gate electrodes G and the scan lines SL are formed of the same material. Moreover, the channel layer CH can be located above the gate electrode G. In this embodiment, a material of the channel layer CH includes (but not limited to): amorphous silicon or an oxide semiconductor material, for example, wherein the oxide semiconductor material includes (but not limited to): indium-gallium-zinc oxide (IGZO), zinc oxide, tin oxide (SnO), indium-zinc oxide, gallium-zinc oxide (GZO), zinc-tin oxide (ZTO) or indium-tin oxide, for example. That is, in this embodiment, the transistor T is an amorphous silicon thin film transistor or an oxide semiconductor thin film transistor, for example. Nevertheless, the invention is not limited thereto. In other embodiments, the transistor T may be a low-temperature polysilicon thin film transistor, a silicon-based thin film transistor or a microcrystalline silicon thin film transistor. In addition, in this embodiment, the transistor T is a bottom gate transistor. Nevertheless, the invention is not limited thereto. In other embodiments, the transistor T may also be a top gate transistor, such as a top gate oxide semiconductor thin film transistor.

Furthermore, the gate insulating layer GI is disposed between the gate electrode G and the channel layer CH, wherein the gate insulating layer GI is formed conformally on the substrate 102 and covers the gate electrode G. A material of the gate insulating layer GI may be (but not limited to) an inorganic material, an organic material or a combination of the foregoing, for example. The inorganic material is (but not limited to) silicon oxide, silicon nitride, silicon oxynitride, or a stack layer of at least two of the foregoing materials; and the organic material is (but not limited to) a polymer material, such as polyimide resin, epoxy resin or acrylic resin, for example.

In addition, the source electrode S and the drain electrode D are located above the channel layer CH, and the source electrode S and the corresponding data line DL are electrically connected. From another aspect, in this embodiment, the drain electrodes D, the source electrodes S and the data lines DL belong to the same film layer. That is, the drain electrodes D, the source electrodes S and the data lines DL may be formed of the same material.

Moreover, in this embodiment, an insulating layer BP is further disposed to cover the transistor T, so as to protect the transistor T or achieves a planarization function. The insulating layer BP is formed conformally on the substrate 102, and a material of the insulating layer BP may be (but not limited to) an inorganic material, an organic material, or a combination of the foregoing, for example. The inorganic material is (but not limited to) silicon oxide, silicon nitride, silicon oxynitride, or a stack layer of at least two of the foregoing materials; and the organic material is (but not limited to) a polymer material, such as polyimide resin, epoxy resin or acrylic resin, for example. In other embodiments, the insulating layer BP may be a stack of multiple layers of materials. For example, after the source electrode S and the drain electrode D are formed, an insulating layer of an inorganic material is first deposited on the source electrode S and the drain electrode D, and then an insulating layer of an organic material is formed on the insulating layer of the inorganic material.

The circuit storage capacitors Cst are arranged in an array corresponding to the red light emitting units RU, the green light emitting units GU and the blue light emitting units BU. Specifically, in this embodiment, one circuit storage capacitor Cst is located under one light emitting unit, wherein the light emitting unit may be the red light emitting unit RU, the green light emitting unit GU or the blue light emitting unit BU. Moreover, in this embodiment, one circuit storage capacitor Cst partially overlaps one light emitting unit. However, in other embodiments, one circuit storage capacitor Cst may completely overlap one light emitting unit. Each circuit storage capacitor Cst includes an upper electrode 106a and a lower electrode 106b.

In this embodiment, the upper electrodes 106a, the source electrodes S, the drain electrodes D and the data lines DL may belong to one film layer while the lower electrodes 106b, the gate electrodes G and the scan lines SL may belong to another film layer. Accordingly, the gate insulating layer GI located between the upper electrode 106a and the lower electrode 106b may serve as a capacitance insulating layer of the circuit storage capacitor Cst. Moreover, in this embodiment, the upper electrode 106a is connected with the corresponding drain electrode D, and the lower electrode 106b is a common electrode, for example.

Furthermore, in this embodiment, the circuit storage capacitors Cst are set to have the same size. Nevertheless, the invention is not limited thereto. Generally, the size of the circuit storage capacitor is related to a characteristic of the light emitting diode. Therefore, the circuit storage capacitors may be designed to have different sizes, so as to compensate for the light emitting characteristics of light emitting diodes of different colors, for example, to compensate for the difference in light emitting efficiency.

The first electrodes 104a are arranged in an array corresponding to the red light emitting units RU, the green light emitting units GU and the blue light emitting units BU. Specifically, one first electrode 104a is electrically connected with one light emitting unit, wherein the light emitting unit may be the red light emitting unit RU, the green light emitting unit GU or the blue light emitting unit BU. The second electrodes 104b are disposed corresponding to the red light emitting units RU, the green light emitting units GU and the blue light emitting units BU, and are in parallel to the data lines DL. Specifically, each second electrode 104b is electrically connected with the red light emitting units RU, the green light emitting units GU or the blue light emitting units BU.

In this embodiment, the first electrodes 104a and the second electrodes 104b are both located above the transistors T. Specifically, in this embodiment, each first electrode 104a is electrically connected with the corresponding transistor T via a contact opening H disposed in the insulating layer BP, and each second electrode 104b is located on a surface of the insulating layer BP. Moreover, in this embodiment, the first electrode 104a and the second electrode 104b partially or completely overlap the corresponding transistor T. More specifically, the first electrode 104a and the second electrode 104b may partially overlap the corresponding circuit storage capacitor Cst. However, in other embodiments, the first electrode 104a and the second electrode 104b may completely overlap the corresponding circuit storage capacitor Cst.

In addition, in this embodiment, the first electrode 104a is positive electrode, and a material of the first electrode 104a is (but not limited to): copper, titanium, nickel, silver, gold, indium, or other suitable conductive materials; while the second electrode 104b is negative electrode, and a material of the second electrode 104b is (but not limited to): copper, titanium, nickel, silver, gold, indium, or other suitable conductive materials, for example. From another aspect, in this embodiment, the first electrode 104a is a P type electrode while the second electrode 104b is an N type electrode, for example. Furthermore, in this embodiment, the second electrode 104b is a ground electrode, for example.

Each red light emitting unit RU, each green light emitting unit GU and each blue light emitting unit BU have similar structures, connection relationships, and arrangement relationships, and a main difference therebetween lies in that: each red light emitting unit RU includes a first red light emitting diode R1, a second red light emitting diode R2 and a third red light emitting diode R3; each green light emitting unit GU includes a first green light emitting diode G1, a second green light emitting diode G2 and a third green light emitting diode G3; and each blue light emitting unit BU includes a first blue light emitting diode B1, a second blue light emitting diode B2 and a third blue light emitting diode B3. Based on the above, one red light emitting unit RU is described hereinafter as an example. From the following description of the red light emitting unit RU, those skilled in the art should be able to understand the structures, connection relationships, and arrangement relationships of the green light emitting unit GU and the blue light emitting unit BU.

It should be noted that the red light emitting unit RU, the green light emitting unit GU and the blue light emitting unit BU of this embodiment respectively include three light emitting diodes. Nevertheless, the invention is not limited thereto. The scope of the invention covers any case where the red light emitting unit RU, the green light emitting unit GU and the blue light emitting unit BU respectively include a plurality of light emitting diodes. For example, the red light emitting unit RU, the green light emitting unit GU and the blue light emitting unit BU may respectively include two, four, five, or more light emitting diodes.

In this embodiment, the first red light emitting diode R1, the second red light emitting diode R2 and the third red light emitting diode R3 of the red light emitting unit RU are together electrically connected with the corresponding transistor T. That is, in this embodiment, the first red light emitting diode R1, the second red light emitting diode R2 and the third red light emitting diode R3 of the red light emitting unit RU are driven by the same transistor T.

In this embodiment, the first red light emitting diode R1, the second red light emitting diode R2, and/or the third red light emitting diode R3 of the red light emitting unit RU may all be located above the corresponding circuit storage capacitor Cst. Specifically, two light emitting diodes (i.e., the second red light emitting diode R2 and the third red light emitting diode R3) of the red light emitting unit RU of this embodiment partially overlap the corresponding circuit storage capacitor Cst. Nevertheless, the invention is not limited thereto. The scope of the invention covers any case where at least one of the light emitting diodes of the red light emitting unit RU overlaps the corresponding circuit storage capacitor Cst. Those skilled in the art should understand that the aforementioned overlap may refer to complete overlap or partial overlap.

In this embodiment, the first red light emitting diode R1, the second red light emitting diode R2 and the third red light emitting diode R3 are arranged side by side along the extension direction of the data line DL. Moreover, in this embodiment, the second red light emitting diode R2 is disposed between the first red light emitting diode R1 and the third red light emitting diode R3. In addition, in this embodiment, the first red light emitting diode R1, the second red light emitting diode R2 and the third red light emitting diode R3 are respectively electrically connected with the first electrode 104a and the second electrode 104b corresponding thereto. That is, the first red light emitting diode R1, the second red light emitting diode R2 and the third red light emitting diode R3 respectively overlap a portion of the first electrode 104a and respectively overlap a portion of the second electrode 104b.

From another aspect, in this embodiment, the first electrode 104a and the second electrode 104b are respectively located on the same side of the first red light emitting diode R1, on the same side of the second red light emitting diode R2, and on the same side of the third red light emitting diode R3. That is, in this embodiment, the first red light emitting diode R1, the second red light emitting diode R2 and the third red light emitting diode R3 are flip-chip micro light emitting diodes. In an embodiment, the flip-chip micro light emitting diode has a length of 1 µm to 1000 µm, a width of 1 µm to 1000 µm, and a height of 0.5 µm to 500 µm, for example. In another embodiment, the flip-chip micro light emitting diode has a length of 1 μm to 100 μm, a width of 1 μm to 100 μm, and a height of 0.5 μm to 30 μm, for example.

It should be noted that, in this embodiment, at least one of the first red light emitting diode R1, the second red light emitting diode R2 and the third red light emitting diode R3 of each red light emitting unit RU, at least one of the first green light emitting diode G1, the second green light emitting diode G2 and the third green light emitting diode G3 of each green light emitting unit GU, and at least one of the first blue light emitting diode B1, the second blue light emitting diode B2 and the third blue light emitting diode B3 of each blue light emitting unit BU overlap the corresponding circuit storage capacitor Cst. Thereby, the display device 10 has favorable space utilization, so as to simplify the layout.

Moreover, in this embodiment, each red light emitting unit RU includes the first red light emitting diode R1, the second red light emitting diode R2 and the third red light emitting diode R3 electrically connected with one another, each green light emitting unit GU includes the first green light emitting diode G1, the second green light emitting diode G2 and the third green light emitting diode G3 electrically connected with one another, and each blue light emitting unit BU includes the first blue light emitting diode B1, the second blue light emitting diode B2 and the third blue light emitting diode B3 electrically connected with one another, and thereby the display device 10 is able to provide a favorable repair function, so as to improve product utilization and reduce the costs. For example, if the first red light emitting diode R1 of the red light emitting unit RU is damaged and does not function, a laser repair device may electrically insulate the damaged first red light emitting diode R1 from the second red light emitting diode R2 and the third red light emitting diode R3, so as to achieve the repair function.

In this embodiment, the opposite substrate 110 includes a substrate 112, and a shielding pattern layer BM, a color filter layer CF and a wavelength conversion layer WT disposed on the substrate 112. Nevertheless, the invention is not limited thereto. In other embodiments, only the wavelength conversion layer WT or only the color filter layer CF may be disposed on the substrate 112.

The shielding pattern layer BM is disposed corresponding to the scan lines SL, the data lines DL and the color filter layer CF (details thereof will be described later), for example. Specifically, in this embodiment, the shielding pattern layer BM overlaps the scan line SL and the data line DL spatially. However, those skilled in the art should understand that the shielding pattern layer BM may completely or partially overlap the scan lines SL and the data lines DL. Moreover, a material of the shielding pattern layer BM includes (but not limited to): a low-reflective material, such as a black resin or a shielding material, for example.

In this embodiment, the color filter layer CF includes a plurality of red filter patterns RCF, a plurality of green filter patterns GCF and a plurality of blue filter patterns BCF, wherein the red filter patterns RCF, the green filter patterns GCF and the blue filter patterns BCF are disposed respectively corresponding to the red light emitting units RU, the green light emitting units GU and the blue light emitting units BU. From another aspect, the shielding pattern layer BM is disposed around the red filter patterns RCF, the green filter patterns GCF and the blue filter patterns BCF. Moreover, the red filter pattern RCF, the green filter pattern GCF and the blue filter pattern BCF may be any filter pattern that is commonly known to those skilled in the art.

In this embodiment, the wavelength conversion layer WT may be disposed on the color filter layer CF and arranged corresponding to the color filter layer CF. That is, the shielding pattern layer BM is also disposed around the wavelength conversion layer WT. In addition, the material of the wavelength conversion layer WT, for example, includes (but is not limited to): a quantum dot material, a fluorescent powder material, a phosphor powder material, or a combination of the foregoing materials.

It should be noted that although the opposite substrate 110 of this embodiment includes the shielding pattern layer BM, the color filter layer CF and the wavelength conversion layer WT disposed on the substrate 112, the invention is not limited thereto. In other embodiments, the opposite substrate 110 may be any opposite substrate that is commonly known to those skilled in the art. Moreover, although in this embodiment, the display device 10 includes the opposite substrate 110, the invention is not limited thereto. In other embodiments, the display device 10 may not include the opposite substrate.

Figure 3:
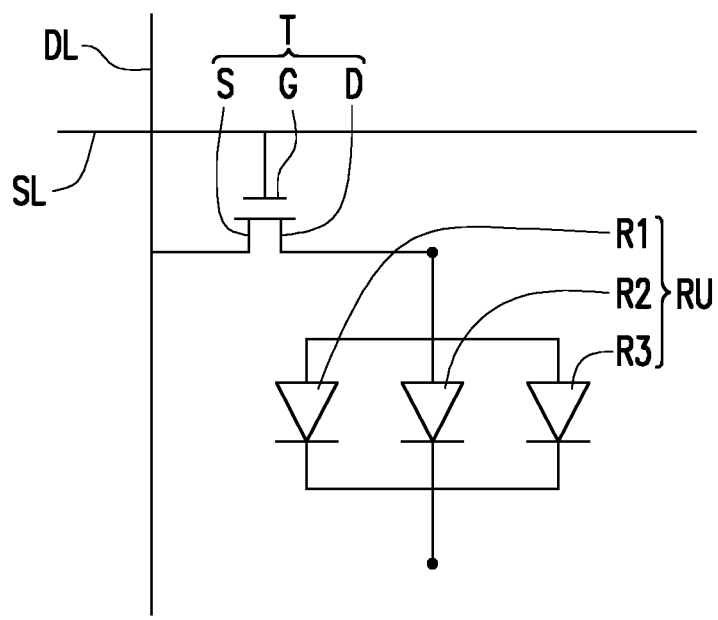
FIG. 3 is a partial equivalent circuit diagram of the display device according to the first embodiment of the invention.

A partial equivalent circuit diagram of the display device 10 is shown in FIG. 3. FIG. 3 illustrates one red light emitting unit RU as an example. Likewise, those skilled in the art should be able to infer the equivalent circuit diagrams related to the green light emitting unit GU and the blue light emitting unit BU from the following description of FIG. 3.

Referring to FIG. 3, the transistor T is electrically connected with the scan line SL, the data line DL and the red light emitting unit RU. Specifically, the gate electrode G of the transistor T is electrically connected with the scan line SL, the source electrode S of the transistor T is electrically connected with the data line DL, and the drain electrode D of the transistor T is electrically connected with positive electrodes of the first red light emitting diode R1, the second red light emitting diode R2 and the third red light emitting diode R3 of the red light emitting unit RU. In addition, in this embodiment, the first red light emitting diode R1, the second red light emitting diode R2 and the third red light emitting diode R3 of the red light emitting unit RU are connected in parallel.

It should be noted that although in the display device 10, the light emitting diodes are driven by one transistor T, the invention is not limited thereto. Hereinafter, other embodiments are described with reference to FIG. 4 and FIG. 5.

Figure 4:
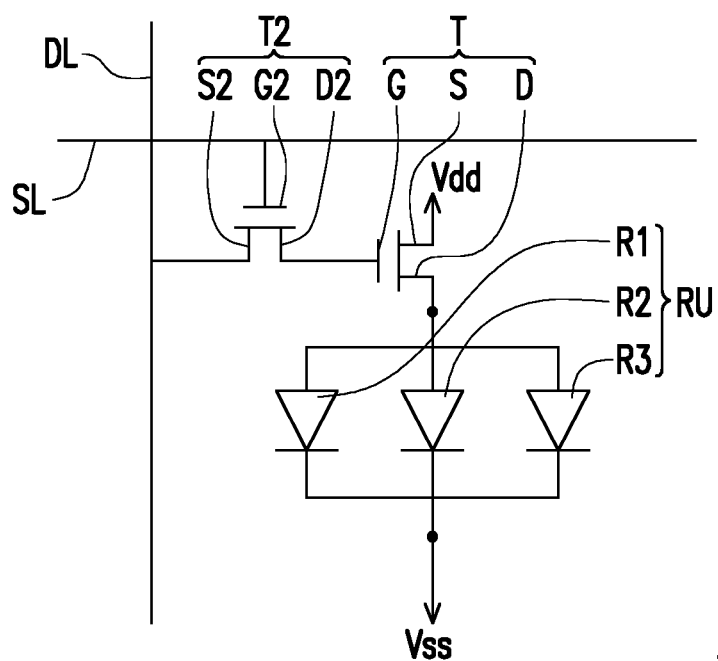
FIG. 4 is a partial equivalent circuit diagram of the display device according to the second embodiment of the invention.

FIG. 4 is a partial equivalent circuit diagram of the display device according to the second embodiment of the invention. Referring to FIG. 4 and FIG. 3, a display device 20 of this embodiment is substantially similar to the display device 10 of FIG. 3. Therefore, the same or similar reference numerals are used to represent the same or similar components and details thereof can be found in the above description and thus are omitted. The difference between the display device 20 and the display device 10 is described hereinafter.

Referring to FIG. 4, the display device 20 includes a transistor T2 which is electrically connected with the scan line SL, the data line DL and the transistor T. Specifically, a gate electrode G2 of the transistor T2 is electrically connected with the scan line SL, a source electrode S2 of the transistor T2 is electrically connected with the data line DL, and a drain electrode D2 of the transistor T2 is electrically connected with the gate electrode G of the transistor T. Moreover, the source electrode S of the transistor T is electrically connected with a power supply voltage $V_{dd}$, and the drain electrode D of the transistor T is electrically connected with the positive electrodes of the first red light emitting diode R1, the second red light emitting diode R2 and the third red light emitting diode R3 of the red light emitting unit RU. In addition, the negative electrodes of the first red light emitting diode R1, the second red light emitting diode R2 and the third red light emitting diode R3 of the red light emitting unit RU are electrically connected with a power supply voltage $V_{ss}$. From another aspect, in this embodiment, the transistor T2 is a switch device, for example.

Figure 5:
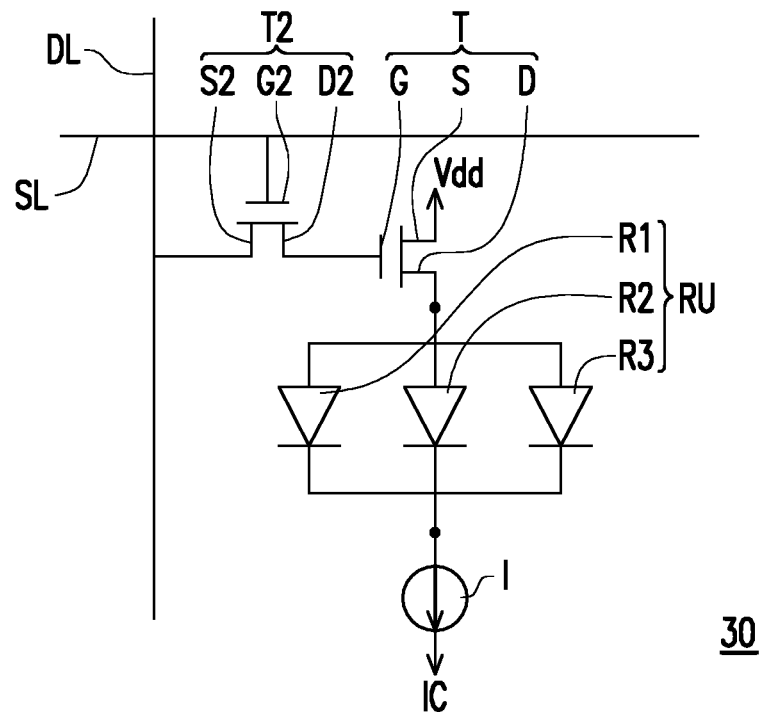
FIG. 5 is a partial equivalent circuit diagram of the display device according to the third embodiment of the invention.

FIG. 5 is a partial equivalent circuit diagram of the display device according to the third embodiment of the invention. Referring to FIG. 5 and FIG. 4, a display device 30 of this embodiment is similar to the display device 20 of FIG. 4. Therefore, the same or similar reference numerals are used to represent the same or similar components and details thereof can be found in the above description and thus are omitted. The difference between the display device 30 and the display device 20 is described hereinafter.

Referring to FIG. 5, the display device 30 includes a current source circuit I. Specifically, the negative electrodes of the first red light emitting diode R1, the second red light emitting diode R2 and the third red light emitting diode R3 of the red light emitting unit RU are electrically connected with the current source circuit I to be electrically connected with an external circuit IC.

According to the aforementioned embodiments, the light emitting diodes in the display devices 10 to 30 are flip-chip micro light emitting diodes. However, the invention is not limited thereto. In other embodiments, the light emitting diodes in the display devices may be vertical micro light emitting diodes. Details are described hereinafter with reference to FIG. 6 and FIG. 7.

Figure 6:
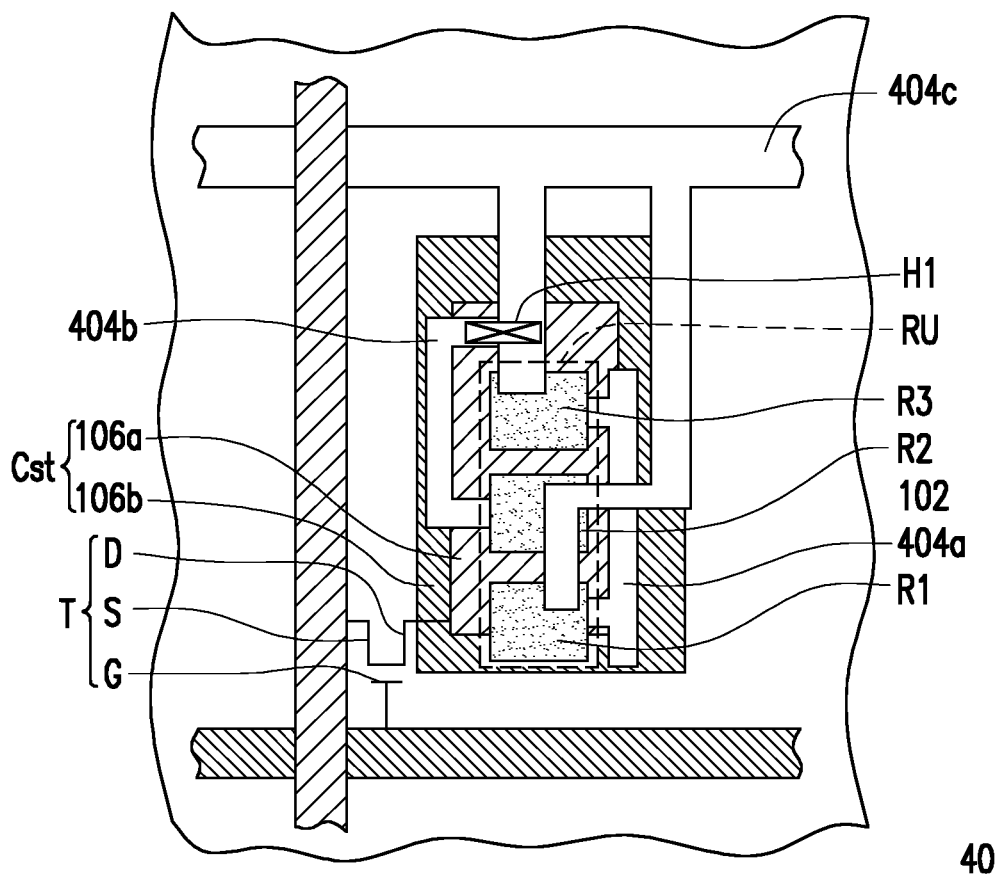
FIG. 6 is a partial top view of the display device according to the fourth embodiment of the invention.
Figure 7:
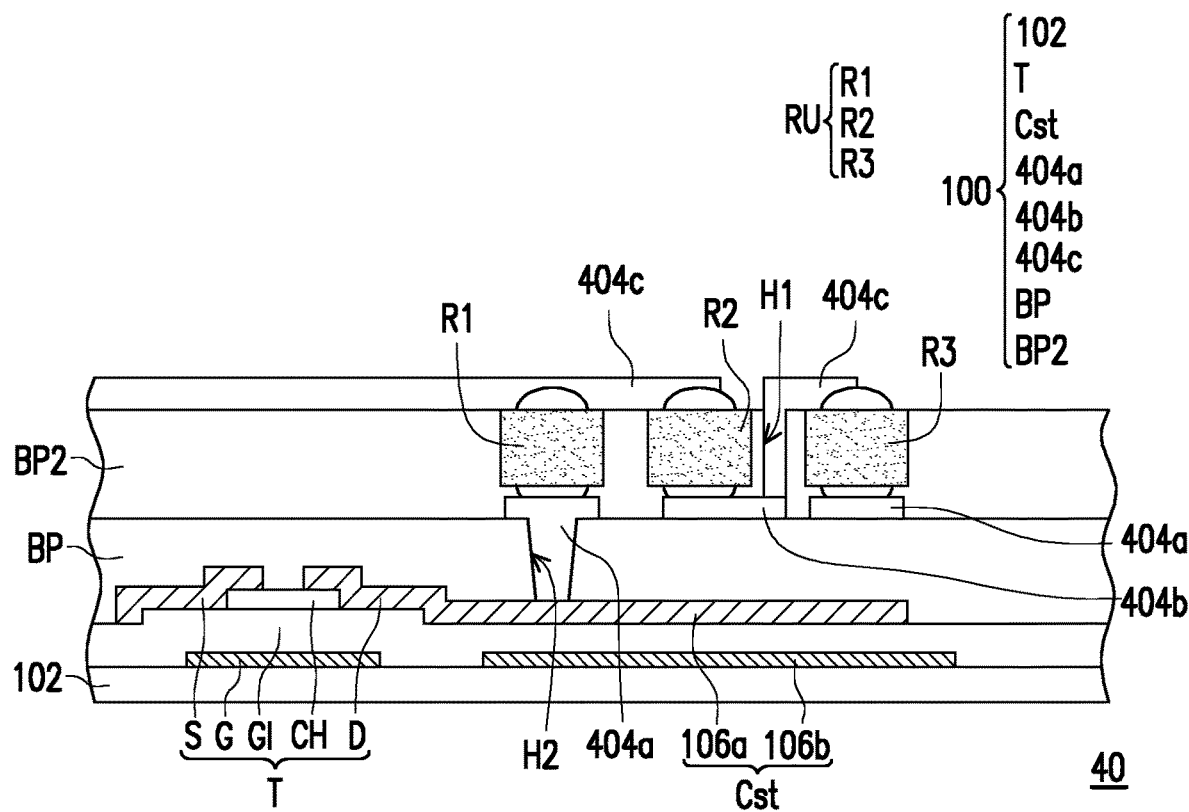
FIG. 7 is a partial cross-sectional view of the display device according to the fourth embodiment of the invention.

FIG. 6 is a partial top view of the display device according to the fourth embodiment of the invention. FIG. 7 is a partial cross-sectional view of the display device according to the fourth embodiment of the invention. Referring to FIG. 6 to FIG. 7 and FIG. 1 to FIG. 2, a display device 40 of this embodiment is similar to the display device 10 of FIG. 1 to FIG. 2. The main difference lies in the connection relationship among the light emitting diodes of each light emitting unit. Therefore, the same or similar reference numerals are used to represent the same or similar components and details thereof can be found in the above description and thus are omitted. The difference between the display device 40 and the display device 10 is described hereinafter. It should be noted that although FIG. 6 and FIG. 7 both illustrate one red light emitting unit RU as an example, those skilled in the art should be able to infer the layout of the display device 40, which includes a plurality of red light emitting units RU, a plurality of green light emitting units GU and a plurality of blue light emitting units BU, from the disclosure of FIG. 1 and FIG. 2. Further, from the following description of FIG. 6 and FIG. 7, those skilled in the art should be able to understand the structures, connection relationships, and arrangement relationships of the green light emitting units GU and the blue light emitting units BU. Moreover, the opposite substrate 110 is omitted from FIG. 6 and FIG. 7.

Referring to FIG. 6 and FIG. 7, the array substrate 100 of the display device 40 further includes a first electrode 404a, a second electrode 404b, a third electrode 404c and an insulating layer BP2 disposed on the substrate 102.

In this embodiment, the insulating layer BP2 is disposed among the first electrode 404a, the second electrode 404b and the third electrode 404c, and the third electrode 404c is connected with the second electrode 404b via a first contact opening H1 disposed in the insulating layer BP2. The insulating layer BP2 may be used for stabilizing the position of the red light emitting unit RU, so as to properly dispose the red light emitting unit RU on the array substrate 100. A material of the insulating layer BP2 includes (but not limited to): glue, resin, silicon oxide, silicon nitride or underfiller, for example. Moreover, the first contact opening H1 is not necessarily at the position illustrated in FIG. 6. Those skilled in the art should understand that, according to different design requirements, the first contact opening H1 may be disposed at any position for connecting the third electrode 404c and the second electrode 404b. For example, in FIG. 6, the first contact opening H1 may be located above the upper electrode 106a, or the first contact opening H1 may be at a position other than the position above the upper electrode 106a.

In this embodiment, the first electrode 404a and the third electrode 404c are located on two opposite sides of the first red light emitting diode R1 of the red light emitting unit RU; the second electrode 404b and the third electrode 404c are located on two opposite sides of the second red light emitting diode R2 of the red light emitting unit RU; and the first electrode 404a and the third electrode 404c are located on two opposite sides of the third red light emitting diode R3 of the red light emitting unit RU.

From another aspect, in this embodiment, the first electrode 404a is electrically connected with the first red light emitting diode R1 and the third red light emitting diode R3; the second electrode 404b is electrically connected with the second red light emitting diode R2; the third electrode 404c is electrically connected with the first red light emitting diode R1, the second red light emitting diode R2 and the third red light emitting diode R3; and the third electrode 404c is electrically connected with the second electrode 404b via the first contact opening H1. That is, in this embodiment, the first red light emitting diode R1, the second red light emitting diode R2 and the third red light emitting diode R3 are electrically connected with one another via the first electrode 404a, the second electrode 404b and the third electrode 404c. Further, in this embodiment, the second red light emitting diode R2 and the third red light emitting diode R3 are connected in series while being connected in parallel with the first red light emitting diode R1.

It should be noted that, in this embodiment, the second red light emitting diode R2 and the third red light emitting diode R3 are connected in series while being connected in parallel with the first red light emitting diode R1, so as to reduce the probability of failure of the display device 40, which may result from short circuit or open circuit, and thereby improve the overall production efficiency.

In addition, in this embodiment, the first electrode 404a and the second electrode 404b are positive electrodes, and a material thereof is (but not limited to): copper, titanium, nickel, silver, gold, indium, or other suitable conductive materials; while the third electrode 404c is negative electrode, and a material thereof is (but not limited to): copper, titanium, nickel, silver, gold, indium, or other suitable conductive materials, for example. From another aspect, in this embodiment, the first electrode 404a and the second electrode 404b are P type electrodes while the third electrode 404c is an N type electrode, for example. Furthermore, in this embodiment, the third electrode 404c is a common electrode electrically connected with a power supply voltage, for example. Moreover, the arrangement of the third electrode 404c is not limited to the disclosure of FIG. 6. Those skilled in the art should understand that, according to different design requirements, the third electrode 404c may adopt other configurations and connection forms to be electrically connected with the power supply voltage.

It should be noted that, in this embodiment, as described above, with the red light emitting unit RU that includes the first red light emitting diode R1, the second red light emitting diode R2 and the third red light emitting diode R3 electrically connected with one another, the display device 40 is able to provide a favorable repair function, so as to improve product utilization and reduce the costs. For example, if the second red light emitting diode R2 of the red light emitting unit RU is damaged and does not function, since the second red light emitting diode R2 is connected in parallel with the first red light emitting diode R1, the first red light emitting diode R1 remains functioning. Thus, the repair function is achieved.

Moreover, in this embodiment, the first electrode 404a, the second electrode 404b and the third electrode 404c are all located above the transistor T. Specifically, in this embodiment, the first electrode 404a is electrically connected with the transistor T via a second contact opening H2 disposed in the insulating layer BP; the second electrode 404b is located on a surface of the insulating layer BP; and the third electrode 404c is located on the surface of the insulating layer BP2 and a portion thereof is connected with the second electrode 404b via the first contact opening H1. In addition, although the first electrode 404a is electrically connected with the transistor T via the second contact opening H2 that overlaps the first red light emitting diode R1 in this embodiment, the invention is not limited thereto. In other embodiments, the first electrode 404a may be electrically connected with the transistor T via a contact opening that overlaps the third red light emitting diode R3. Furthermore, although in this embodiment the first electrode 404a is a continuous conductive pattern that is in contact with both the first red light emitting diode R1 and the third red light emitting diode R3 and is electrically connected with the transistor T via one contact opening (i.e., the second contact opening H2), the invention is not limited thereto. In other embodiments, the first electrode 404a may be two independent conductive patterns that are respectively in contact with the first red light emitting diode R1 and the third red light emitting diode R3 and are electrically connected with the transistor T via two contact openings. Further, in this embodiment, the first electrode 404a, the second electrode 404b and the third electrode 404c may partially or completely overlap the transistor T.

Besides, in this embodiment, the first red light emitting diode R1, the second red light emitting diode R2 and the third red light emitting diode R3 of the red light emitting unit RU all overlap the corresponding circuit storage capacitor Cst. Nevertheless, the invention is not limited thereto. The scope of the invention covers any case where at least one of the light emitting diodes of the red light emitting unit RU overlaps the corresponding circuit storage capacitor Cst. Those skilled in the art should understand that the aforementioned overlap may refer to complete overlap or partial overlap. For example, the area of the lower electrode 106b may be reduced to only completely overlap the second red light emitting diode R2 and the third red light emitting diode R3, such that only two of the light emitting diodes of the red light emitting unit RU overlap the corresponding circuit storage capacitor Cst.

It should be noted that, in this embodiment, as described above, at least one of the first red light emitting diode R1, the second red light emitting diode R2 and the third red light emitting diode R3 of the red light emitting unit RU overlaps the corresponding circuit storage capacitor Cst. Thereby, the display device 40 has favorable space utilization, so as to simplify the layout.

Figure 8:
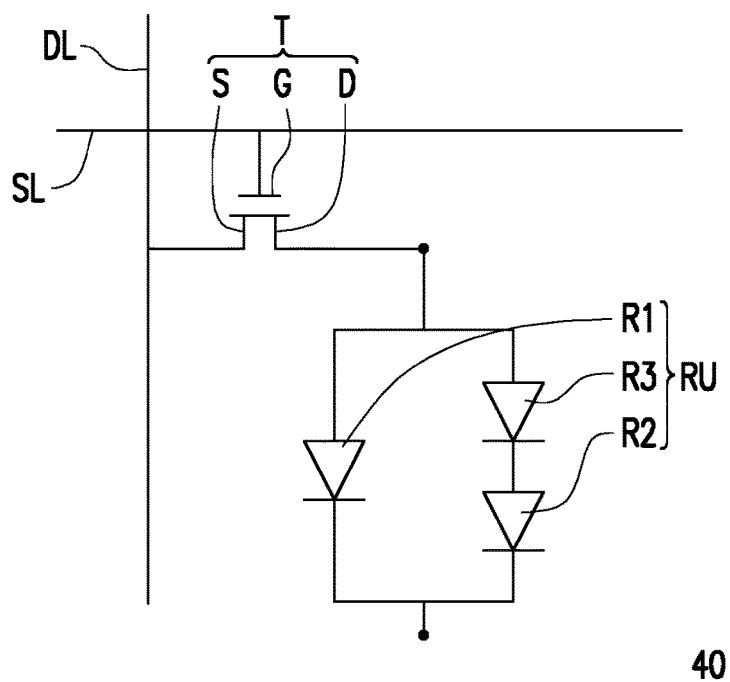
FIG. 8 is a partial equivalent circuit diagram of the display device according to the fourth embodiment of the invention.

Additionally, a partial equivalent circuit diagram of the display device 40 is illustrated in FIG. 8. Likewise, although one red light emitting unit RU is illustrated in FIG. 8 as an example, those skilled in the art should be able to infer the equivalent circuit diagrams of the green light emitting unit GU and the blue light emitting unit BU that may be included in the display device 40 from the disclosure of FIG. 1 and FIG. 2 and the following description of FIG. 8.

Referring to FIG. 8, the transistor T is electrically connected with the scan line SL, the data line DL and the red light emitting unit RU. Specifically, the gate electrode G of the transistor T is electrically connected with the scan line SL, the source electrode S of the transistor T is electrically connected with the data line DL, and the drain electrode D of the transistor T is electrically connected with the positive electrodes of the first red light emitting diode R1 and the third red light emitting diode R3 of the red light emitting unit RU. Moreover, in this embodiment, the negative electrode of the third red light emitting diode R3 is electrically connected with the positive electrode of the second red light emitting diode R2. That is, in this embodiment, the second red light emitting diode R2 and the third red light emitting diode R3 are connected in series while being connected in parallel with the first red light emitting diode R1.

It should be noted that although in the display device 40, the light emitting diodes are driven by one transistor T, the invention is not limited thereto. Hereinafter, other embodiments are described with reference to FIG. 9 and FIG. 10.

Figure 9:
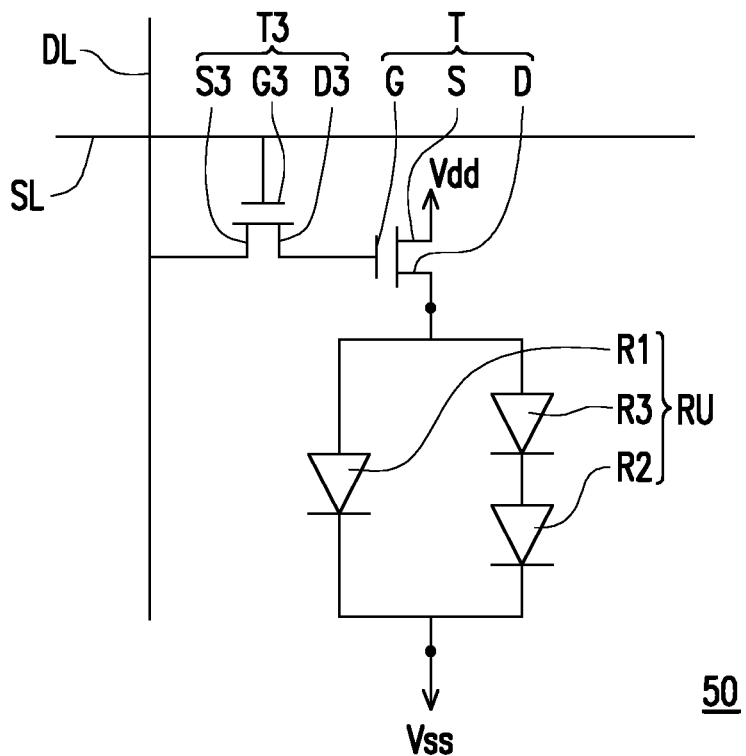
FIG. 9 is a partial equivalent circuit diagram of the display device according to the fifth embodiment of the invention.

FIG. 9 is a partial equivalent circuit diagram of the display device according to the fifth embodiment of the invention. Referring to FIG. 9 and FIG. 8, a display device 50 of this embodiment is similar to the display device 40 of FIG. 8. Therefore, the same or similar reference numerals are used to represent the same or similar components and details thereof can be found in the above description and thus are omitted. The difference between the display device 50 and the display device 40 is described hereinafter.

Referring to FIG. 9, the display device 50 includes a transistor T3 which is electrically connected with the scan line SL, the data line DL and the transistor T. Specifically, a gate electrode G3 of the transistor T3 is electrically connected with the scan line SL, a source electrode S3 of the transistor T3 is electrically connected with the data line DL, and a drain electrode D3 of the transistor T3 is electrically connected with the gate electrode G of the transistor T. Moreover, the source electrode S of the transistor T is electrically connected with a power supply voltage $V_{dd}$, and the drain electrode D of the transistor T is electrically connected with the positive electrodes of the first red light emitting diode R1 and the third red light emitting diode R3 of the red light emitting unit RU. In addition, the negative electrodes of the first red light emitting diode R1 and the second red light emitting diode R2 of the red light emitting unit RU are electrically connected with a power supply voltage $V_{ss}$. From another aspect, in this embodiment, the transistor T3 is a switch device, for example.

Figure 10:
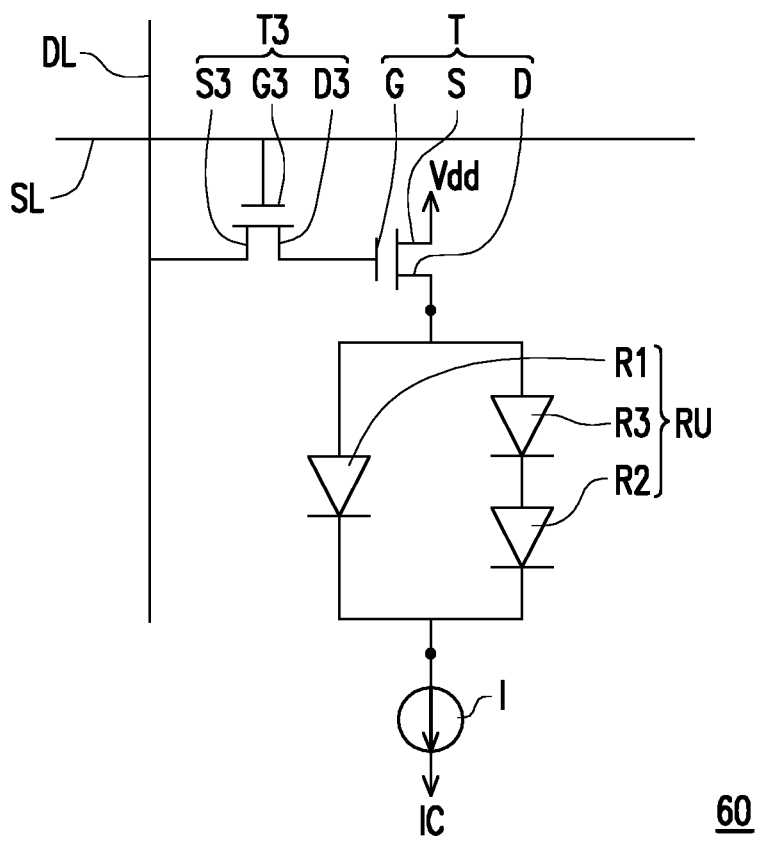
FIG. 10 is a partial equivalent circuit diagram of the display device according to the sixth embodiment of the invention.

FIG. 10 is a partial equivalent circuit diagram of the display device according to the sixth embodiment of the invention. Referring to FIG. 10 and FIG. 9, a display device 60 of this embodiment is similar to the display device 50 of FIG. 9. Therefore, the same or similar reference numerals are used to represent the same or similar components and details thereof can be found in the above description and thus are omitted. The difference between the display device 60 and the display device 50 is described hereinafter.

Referring to FIG. 10, the display device 60 includes a current source circuit I. Specifically, the negative electrodes of the first red light emitting diode R1 and the second red light emitting diode R2 of the red light emitting unit RU are electrically connected with the current source circuit I to be electrically connected with the external circuit IC.

Besides, although the transistor T is described as a bottom gate transistor as an example in the above first to sixth embodiments, the invention is not limited thereto. In other embodiments, the transistor T may be a top gate transistor, as shown in FIG. 11.

Figure 11:
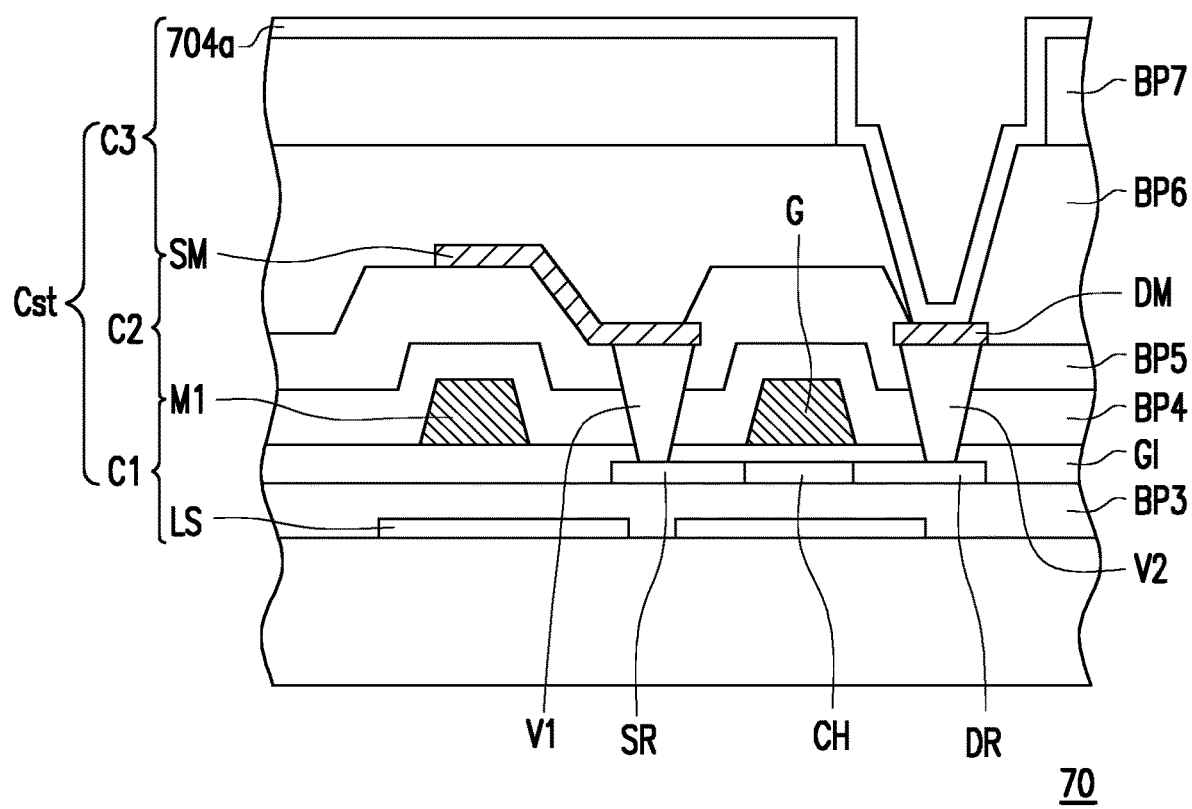
FIG. 11 is a partial cross-sectional view of the display device according to the seventh embodiment of the invention.

Referring to FIG. 11, the gate electrode G is located above the channel layer CH. The source region SR, the drain region DR and the channel layer CH are formed in a semiconductor layer, wherein the material of the semiconductor layer is polysilicon. That is, in this embodiment, the transistor T is a low-temperature polysilicon thin film transistor. The gate insulating layer GI is located between the semiconductor layer and the gate electrode G. The source region SR is electrically connected with a source metal layer SM via a contact V1 formed in the gate insulating layer GI, an insulating layer BP4 and an insulating layer BP5, and the source metal layer SM is further electrically connected with the data line DL. The drain region DR is electrically connected with a drain metal layer DM via a contact V2 formed in the gate insulating layer GI, the insulating layer BP4 and the insulating layer BP5.

Moreover, in this embodiment, the circuit storage capacitor Cst may be formed by connecting in series a first sub storage capacitor C1 formed of a conductive pattern LS and a conductive pattern M1, a second sub storage capacitor C2 formed of the conductive pattern M1 and the source metal layer SM, and a third sub storage capacitor C3 formed of the source metal layer SM and a first electrode 704a. An insulating layer BP3 and the gate insulating layer GI located between the conductive pattern LS and the conductive pattern M1 serve as a capacitance insulating layer of the first sub storage capacitor C1; the insulating layer BP4 and the insulating layer BP5 located between the conductive pattern M1 and the source metal layer SM serve as a capacitance insulating layer of the second sub storage capacitor C2; and an insulating layer BP6 and an insulating layer BP7 located between the source metal layer SM and the first electrode 704a serve as a capacitance insulating layer of the third sub storage capacitor C3. In this embodiment, the conductive pattern LS may be a shielding material. In this embodiment, the conductive pattern M1 and the gate electrode G belong to the same film layer. That is, the conductive pattern M1 and the gate electrode G are formed of the same material. Furthermore, in this embodiment, the conductive pattern M1 is a common electrode, for example.

Besides, although the above first to sixth embodiments illustrate that each light emitting unit includes three light emitting diodes as an example, the invention is not limited thereto. In other embodiments, each light emitting unit may include four light emitting diodes, as shown in FIG. 12 and FIG. 13.

Figure 12:
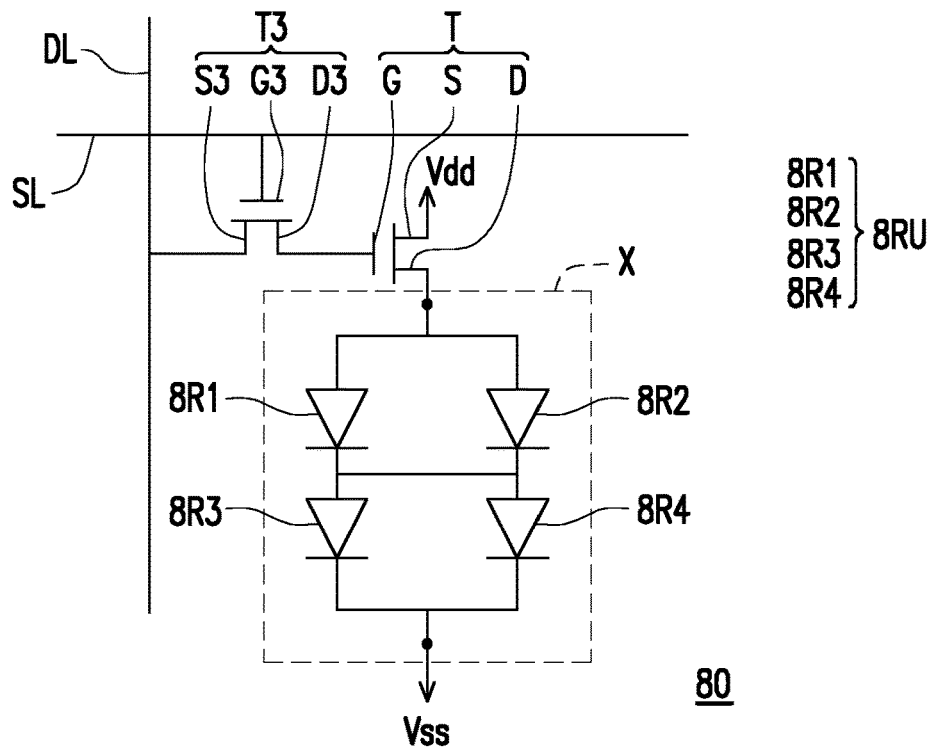
FIG. 12 is a partial equivalent circuit diagram of the display device according to the eighth embodiment of the invention.

FIG. 12 is a partial equivalent circuit diagram of the display device according to the eighth embodiment of the invention. FIG. 13 is a diagram of an area X in FIG. 12. Referring to FIG. 12 and FIG. 4 or FIG. 9, a display device 80 of this embodiment is similar to the display device 20 of FIG. 4 or the display device 50 of FIG. 9. The main difference lies in that: in the display device 80, a red light emitting unit 8RU includes four red light emitting diodes, i.e., a first red light emitting diode 8R1, a second red light emitting diode 8R2, a third red light emitting diode 8R3 and a fourth red light emitting diode 8R4; while in the display device 20 or the display device 50, one red light emitting unit RU includes three red light emitting diodes, i.e., the first red light emitting diode R1, the second red light emitting diode R2 and the third red light emitting diode R3. Therefore, the same or similar reference numerals are used to represent the same or similar components and details thereof can be found in the above description and thus are omitted. The difference between the display device 80 and the display device 20 or 50 is described hereinafter.

Figure 13:
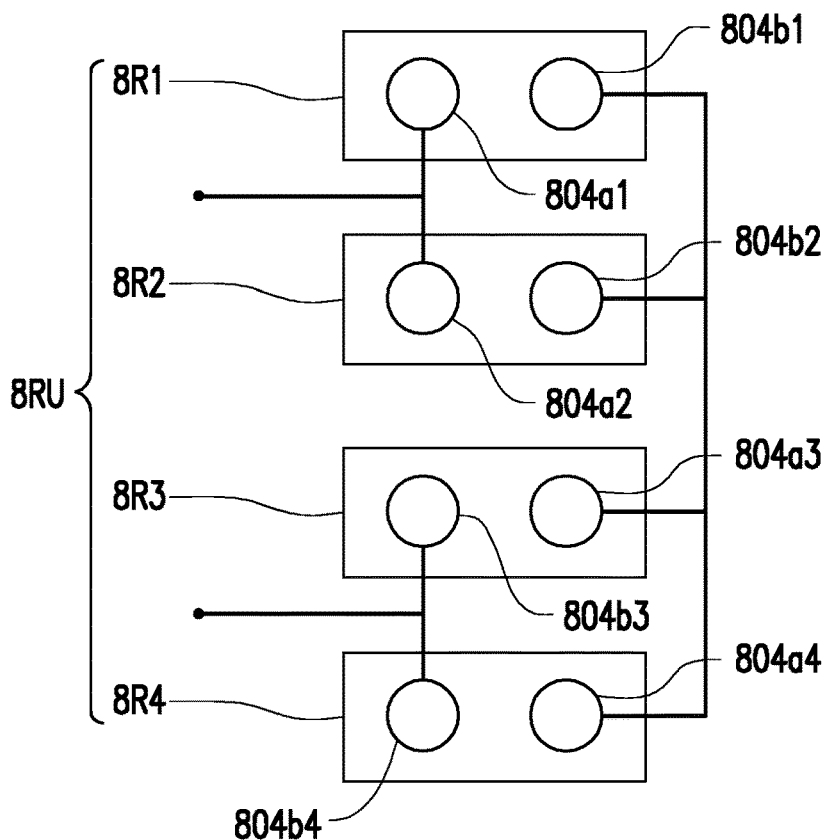
FIG. 13 is a diagram of the area X in FIG. 12.

Referring to FIG. 12 and FIG. 13, in this embodiment, the first red light emitting diode 8R1 and the second red light emitting diode 8R2 are connected in parallel, and the third red light emitting diode 8R3 and the fourth red light emitting diode 8R4 are connected in parallel. Besides, the first red light emitting diode 8R1 and the second red light emitting diode 8R2 that are connected in parallel and the third red light emitting diode 8R3 and the fourth red light emitting diode 8R4 that are connected in parallel are connected in series. That is, in this embodiment, the first red light emitting diode 8R1, the second red light emitting diode 8R2, the third red light emitting diode 8R3 and the fourth red light emitting diode 8R4 of the red light emitting unit 8RU are electrically connected with one another by a combination of parallel connection and series connection.

Further, in this embodiment, the first red light emitting diode 8R1 is electrically connected with a first electrode 804a1 and a second electrode 804b1, the second red light emitting diode 8R2 is electrically connected with a first electrode 804a2 and a second electrode 804b2, the third red light emitting diode 8R3 is electrically connected with a first electrode 804a3 and a second electrode 804b3, and the fourth red light emitting diode 8R4 is electrically connected with a first electrode 804a4 and a second electrode 804b4. Specifically, in this embodiment, the first electrode 804a1 and the first electrode 804a2 are connected in parallel while being electrically connected with the drain D electrode of the transistor T, for example. The second electrode 804b3 and the second electrode 804b4 are connected in parallel while being electrically connected with the power supply voltage $V_{ss}$. The second electrode 804b1, the second electrode 804b2, the first electrode 804a3 and the first electrode 804a4 are connected in series with one another. That is, in this embodiment, the first red light emitting diode 8R1, the second red light emitting diode 8R2, the third red light emitting diode 8R3 and the fourth red light emitting diode 8R4 of the red light emitting unit 8RU are electrically connected with one another via the first electrodes 804a1 to 804a4 and the second electrodes 804b1 to 804b4.

In this embodiment, the first electrodes 804a1 to 804a4 are positive electrodes while the second electrodes 804b1 to 804b4 are negative electrodes, for example. From another aspect, in this embodiment, the first electrodes 804a1 to 804a4 are P type electrodes and the second electrodes 804b1 to 804b4 are N type electrodes, for example.

It should be noted that, in this embodiment, the first red light emitting diode 8R1 and the second red light emitting diode 8R2 are connected in parallel, the third red light emitting diode 8R3 and the fourth red light emitting diode 8R4 are connected in parallel, and the first red light emitting diode 8R1 and the second red light emitting diode 8R2 that are connected in parallel and the third red light emitting diode 8R3 and the fourth red light emitting diode 8R4 that are connected in parallel are connected in series. Accordingly, the probability of failure of the display device 80, which may result from short circuit or open circuit, is reduced so as to improve the overall production efficiency.

Further, in this embodiment, with the red light emitting unit 8RU that includes the first red light emitting diode 8R1, the second red light emitting diode 8R2, the third red light emitting diode 8R3 and the fourth red light emitting diode 8R4 electrically connected with one another, the display device 80 is able to provide a favorable repair function, so as to improve product utilization and reduce the costs. For example, if the second red light emitting diode 8R2 of the red light emitting unit 8RU is damaged and does not function, since the second red light emitting diode 8R2 is connected in parallel with the first red light emitting diode 8R1, the first red light emitting diode 8R1 remains functioning. Thus, the repair function is achieved.

Moreover, as described above, at least one of the first red light emitting diode 8R1, the second red light emitting diode 8R2, the third red light emitting diode 8R3 and the fourth red light emitting diode 8R4 of the red light emitting unit 8RU overlaps the corresponding circuit storage capacitor Cst. Thereby, the display device 80 has favorable space utilization, so as to simplify the layout. Nevertheless, in other embodiments, the first red light emitting diode 8R1, the second red light emitting diode 8R2, the third red light emitting diode 8R3 and the fourth red light emitting diode 8R4 in the display device 80 may not overlap the corresponding circuit storage capacitor Cst.

In addition, although the red light emitting unit 8RU includes four light emitting diodes and the four light emitting diodes are connected in parallel in groups of two and then connected in series to be electrically connected with one another in this embodiment, the invention is not limited thereto. In other embodiments, the red light emitting unit 8RU may include more than four light emitting diodes, e.g., five light emitting diodes, as long as these light emitting diodes are electrically connected with one another by a combination of parallel connection and series connection.

Besides, although the above first to sixth embodiments illustrate that each light emitting unit includes three light emitting diodes as an example, the invention is not limited thereto. In other embodiments, each light emitting unit may include two light emitting diodes, as shown in FIG. 14 and FIG. 15.

Figure 14:
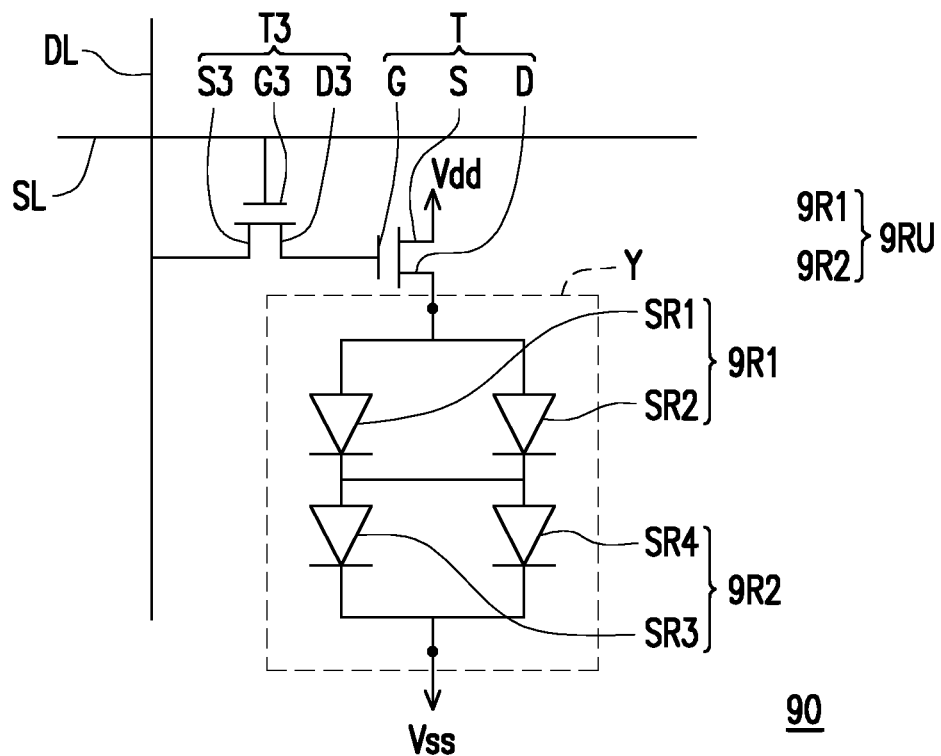
FIG. 14 is a partial equivalent circuit diagram of the display device according to the ninth embodiment of the invention.

FIG. 14 is a partial equivalent circuit diagram of the display device according to the ninth embodiment of the invention. FIG. 15 is a diagram of an area Y in FIG. 14. Referring to FIG. 14 and FIG. 4 or FIG. 9, a display device 90 of this embodiment is similar to the display device 20 of FIG. 4 or the display device 50 of FIG. 9. The main difference lies in that: in the display device 90, a red light emitting unit 9RU includes two red light emitting diodes, i.e., a first red light emitting diode 9R1 and a second red light emitting diode 9R2; while in the display device 20 or the display device 50, one red light emitting unit RU includes three red light emitting diodes, i.e., the first red light emitting diode R1, the second red light emitting diode R2 and the third red light emitting diode R3. Therefore, the same or similar reference numerals are used to represent the same or similar components and details thereof can be found in the above description and thus are omitted. The difference between the display device 90 and the display device 20 or 50 is described hereinafter.

Figure 15:
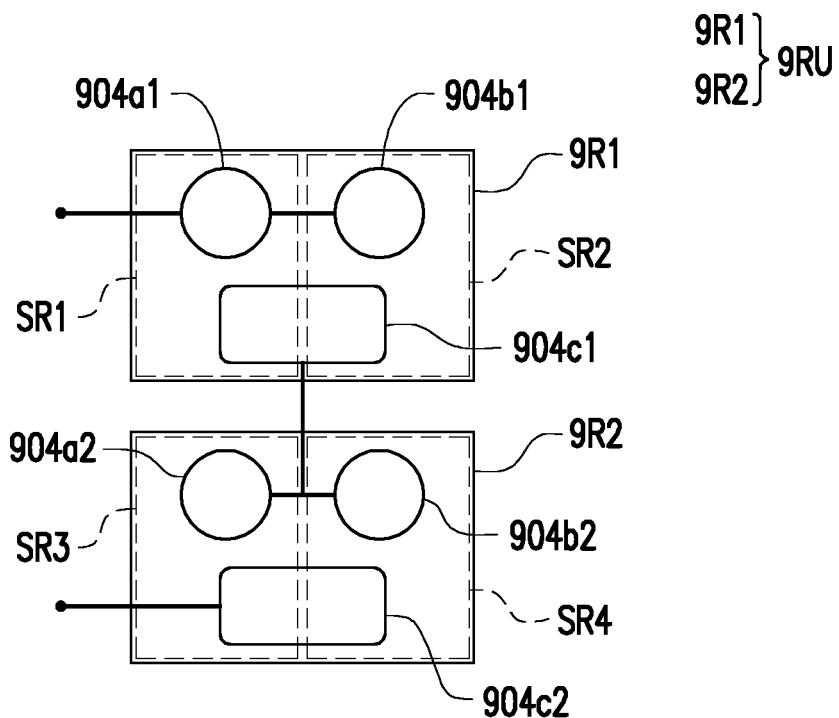
FIG. 15 is a diagram of the area Y in FIG. 14.

Referring to FIG. 14 and FIG. 15, in this embodiment, the first red light emitting diode 9R1 is electrically connected with a first electrode 904a1, a second electrode 904b1 and a third electrode 904c1 while the second red light emitting diode 9R2 is electrically connected with a first electrode 904a2, a second electrode 904b2 and a third electrode 904c2. In this embodiment, the first electrode 904a1, the second electrode 904b1, the first electrode 904a2 and the second electrode 904b2 are positive electrodes while the third electrode 904c1 and the third electrode 904c2 are negative electrodes, for example. From another aspect, in this embodiment, the first electrode 904a1, the second electrode 904b1, the first electrode 904a2 and the second electrode 904b2 are P type electrodes while the third electrode 904c1 and the third electrode 904c2 are N type electrodes, for example.

Besides, in this embodiment, the first red light emitting diode 9R1 includes sub light emitting diodes, e.g., a sub red light emitting diode SR1 and a sub red light emitting diode SR2; and the second red light emitting diode 9R2 includes sub light emitting diodes, e.g., a sub red light emitting diode SR3 and a sub red light emitting diode SR4. Specifically, in this embodiment, the sub red light emitting diode SR1 is electrically connected with the first electrode 904a1 and the third electrode 904c1, the sub red light emitting diode SR2 is electrically connected with the second electrode 904b1 and the third electrode 904c1, the sub red light emitting diode SR3 is electrically connected with the first electrode 904a2 and the third electrode 904c2, and the sub red light emitting diode SR4 is electrically connected with the second electrode 904b2 and the third electrode 904c2. That is, in this embodiment, the first red light emitting diode 9R1 and the second red light emitting diode 9R2 respectively have two independent light emitting regions. Therefore, with the aforementioned first red light emitting diode that includes two independent light emitting regions, for example, there is no need to dispose multiple red light emitting diodes to form multiple light emitting regions. Thus, the number of the light emitting diodes may be reduced to lower the costs, which is applicable to a high-resolution display device.

Furthermore, in this embodiment, the first electrode 904a1 and the second electrode 904b1 are connected in parallel while being electrically connected with the drain electrode D of the transistor T, for example. The first electrode 904a2 and the second electrode 904b2 are connected in parallel, and the third electrode 904c1 is connected in series with the first electrode 904a2 and the second electrode 904b2 that are connected in parallel. Moreover, the third electrode 904c2 is electrically connected with the power supply voltage $V_{ss}$. Accordingly, the sub red light emitting diode SR1 and the sub red light emitting diode SR2 are connected in parallel, the sub red light emitting diode SR3 and the sub red light emitting diode SR4 are connected in parallel, and the sub red light emitting diode SR1 and the sub red light emitting diode SR2 that are connected in parallel and the sub red light emitting diode SR3 and the sub red light emitting diode SR4 that are connected in parallel are connected in series. That is, in this embodiment, the first electrode 904a1, the second electrode 904b1, the third electrode 904c1, the first electrode 904a2, the second electrode 904b2 and the third electrode 904c2 are configured by a combination of parallel connection and series connection, so as to electrically connect the sub red light emitting diode SR1, the sub red light emitting diode SR2, the sub red light emitting diode SR3 and the sub red light emitting diode SR4 of the red light emitting unit 9RU with one another.

It should be noted that, in this embodiment, the first electrode 904a1, the second electrode 904b1, the third electrode 904c1, the first electrode 904a2, the second electrode 904b2 and the third electrode 904c2 are configured by a combination of parallel connection and series connection, such that the sub red light emitting diode SR1 and the sub red light emitting diode SR2 are connected in parallel, the sub red light emitting diode SR3 and the sub red light emitting diode SR4 are connected in parallel, and the sub red light emitting diode SR1 and the sub red light emitting diode SR2 that are connected in parallel and the sub red light emitting diode SR3 and the sub red light emitting diode SR4 that are connected in parallel are connected in series. Thereby, the probability of failure of the display device 90, which may result from short circuit or open circuit, is reduced so as to improve the overall production efficiency.

Further, in this embodiment, with the red light emitting unit 9RU that includes the sub red light emitting diodes SR1 to SR4 electrically connected with one another, the display device 90 is able to provide a favorable repair function, so as to improve product utilization and reduce the costs. For example, if the sub red light emitting diode SR2 of the red light emitting unit 9RU is damaged and does not function, since the sub red light emitting diode SR2 is connected in parallel with the sub red light emitting diode SR1, the sub red light emitting diode SR1 remains functioning. Thus, the repair function is achieved.

Moreover, as described above, at least one of the first red light emitting diode 9R1 and the second red light emitting diode 9R2 of the red light emitting unit 9RU overlaps the corresponding circuit storage capacitor Cst. Thereby, the display device 90 has favorable space utilization, so as to simplify the layout. Nevertheless, in other embodiments, the first red light emitting diode 9R1 and the second red light emitting diode 9R2 in the display device 90 may not overlap the corresponding circuit storage capacitor Cst.

In addition, although the red light emitting unit 9RU includes two red light emitting diodes (i.e., the first red light emitting diode 9R1 and the second red light emitting diode 9R2) in this embodiment, the invention is not limited thereto. In other embodiments, the red light emitting unit 9RU may include more than two red light emitting diodes, e.g., three red light emitting diodes.

In addition, although the first red light emitting diode 9R1 and the second red light emitting diode 9R2 respectively include two sub red light emitting diodes in this embodiment, the invention is not limited thereto. In other embodiments, the first red light emitting diode 9R1 and the second red light emitting diode 9R2 may respectively include more than two sub red light emitting diodes, i.e., more than two independent light emitting regions.

To conclude, in the display device of the invention, the light emitting unit includes multiple light emitting diodes that are electrically connected with one another and are together electrically connected with one transistor. Thus, the display device is able to provide a favorable repair function and thereby improve product utilization and reduce the costs. Further, in the display device of the invention, at least one of the multiple light emitting diodes, which are together electrically connected with one active device, of the light emitting unit is disposed to overlap the capacitor, e.g., the circuit storage capacitor. Accordingly, the display device has favorable space utilization, so as to simplify the layout. In addition, in the display device of the invention, multiple light emitting diodes of the light emitting unit are electrically connected with one another by a combination of parallel connection and series connection, so as to reduce the probability of failure of the display device, which may result from short circuit or open circuit, and thereby improve the overall production efficiency.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A display device, comprising:
   a first substrate;
   a first transistor disposed on the first substrate;
   a light emitting unit disposed on the first substrate and electrically connected to the first transistor, wherein the light emitting unit comprises a first light emitting diode, a second light emitting diode, a third light emitting diode, and a fourth light emitting diode, the first light emitting diode and the second light emitting diode are electrically connected in parallel, the third light emitting diode and the fourth light emitting diode are electrically connected in parallel, and the first light emitting diode and the second light emitting diode that are electrically connected in parallel and the third light emitting diode and the fourth light emitting diode that are electrically connected in parallel are electrically connected in series;
   a second substrate disposed opposite to the first substrate;
   a color filter layer, disposed on the second substrate;
   a shielding pattern layer, disposed on the second substrate and corresponding to the color filter layer; and
   a wavelength conversion layer, disposed on the color filter layer.

2. The display device according to claim 1, wherein the first light emitting diode, the second light emitting diode, a third light emitting diode, and a fourth light emitting diode respectively comprise a first electrode and a second electrode, wherein the first electrode is electrically connected with a first voltage signal, and the second electrode is electrically connected with a second voltage signal.

3. The display device according to claim 2, wherein the first electrode is positive electrodes, and the second electrode is negative electrode.

4. The display device according to claim 2, wherein the first electrode is P type electrodes, and the second electrode is N type electrode.

5. The display device according to claim 2, wherein the second electrode of the first light emitting diode is connected with the second electrode of the second light emitting diode, and the second electrode of the third light emitting diode is connected with the second electrode of the fourth light emitting diode.

6. The display device according to claim 2, wherein the first electrode of the first light emitting diode and the first electrode of the second light emitting diode are connected in parallel, and the first electrode of the third light emitting diode and the first electrode of the fourth light emitting diode are connected in parallel.

7. The display device according to claim 6, wherein the first electrode of the first light emitting diode and the first electrode of the second light emitting diode are electrically connected with a drain electrode of the first transistor.

8. The display device according to claim 7, wherein the second electrode of the first light emitting diode and the second electrode of the second light emitting diode are connected in series with the first electrode of the third light emitting diode and the first electrode of the fourth light emitting diode.

9. The display device according to claim 8, wherein the second electrode of the third light emitting diode and the second electrode of the fourth light emitting diode are electrically connected with a power supply voltage.

10. The display device according to claim 2, wherein the first electrode of the first light emitting diode and the first electrode of the second light emitting diode are connected in parallel, the second electrode of the third light emitting diode and the second electrode of the fourth light emitting diode are connected in parallel, and the second electrode of the first light emitting diode, the second electrode of the second light emitting diode, the first electrode of the third light emitting diode and the first electrode of the fourth light emitting diode are connected in series.

11. The display device according to claim 2, wherein the first electrode of the first light emitting diode and the first electrode of the second light emitting diode are electrically connected with a drain electrode of the first transistor, and the second electrode of the third light emitting diode and the second electrode of the fourth light emitting diode are electrically connected with a power supply voltage.

12. The display device according to claim 1, further comprising a capacitor disposed on the first substrate, wherein the light emitting unit is arranged corresponding to the capacitor.

13. The display device according to claim 12, wherein at least one of the first light emitting diode, the second light emitting diode, a third light emitting diode, and a fourth light emitting diode overlaps the capacitor.

14. The display device according to claim 12, wherein the capacitor comprises an upper electrode and a lower electrode, and the upper electrode, a source electrode of the first transistor and a drain electrode of the first transistor belong to one film layer while the lower electrode and a gate electrode of the first transistor belong to another film layer.

15. The display device according to claim 1, further comprising a scan line and a data line disposed on the first substrate, wherein an extension direction of the scan line is different from an extension direction of the data line, and the first transistor is electrically connected with the scan line and the data line.

16. The display device according to claim 15, further comprising a second transistor disposed on the first substrate, wherein the second transistor is electrically connected with the scan line, the data line and the first transistor.

17. The display device according to claim 16, wherein a gate electrode of the second transistor is electrically connected with the scan line, a source electrode of the second transistor is electrically connected with the data line, and a drain electrode of the second transistor is electrically connected with a gate electrode of the first transistor.

18. The display device according to claim 1, wherein each of the first light emitting diode, the second light emitting diode, a third light emitting diode, and a fourth light emitting diode is a flip-chip micro light emitting diode or a vertical micro light emitting diode.

19. The display device according to claim 1, wherein a material of the wavelength conversion layer includes a quantum dot material, a fluorescent powder material, or a phosphor powder material.

* * * * *